United States Patent
Tsotsis

(10) Patent No.: US 10,442,116 B2
(45) Date of Patent: Oct. 15, 2019

(54) LOW-COST TOOLING AND METHOD FOR MANUFACTURING THE SAME

(71) Applicant: The Boeing Company, Chicago, IL (US)

(72) Inventor: Thomas K. Tsotsis, Santa Ana, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/662,661

(22) Filed: Jul. 28, 2017

(65) Prior Publication Data

US 2017/0320241 A1    Nov. 9, 2017

Related U.S. Application Data

(62) Division of application No. 14/677,575, filed on Apr. 2, 2015, now Pat. No. 9,744,694.

(51) Int. Cl.

| | |
|---|---|
| *B23K 10/00* | (2006.01) |
| *B29C 33/40* | (2006.01) |
| *C25D 7/00* | (2006.01) |
| *C25D 5/34* | (2006.01) |
| *C25D 5/54* | (2006.01) |
| *C23C 16/00* | (2006.01) |
| *B29C 33/02* | (2006.01) |
| *B29C 33/38* | (2006.01) |

(52) U.S. Cl.
CPC .............. *B29C 33/40* (2013.01); *C23C 16/00* (2013.01); *C25D 5/34* (2013.01); *C25D 5/54* (2013.01); *C25D 7/00* (2013.01); *B29C 33/02* (2013.01); *B29C 33/3828* (2013.01); *B29C 33/405* (2013.01); *B29K 2883/00* (2013.01); *B29K 2905/12* (2013.01); *B29K 2995/0005* (2013.01)

(58) Field of Classification Search
CPC ....... B29C 33/40; B29C 33/405; B29C 38/28; C23C 16/00; C25D 5/34; C25D 5/54; C25D 7/00; B29K 2883/00; B29K 2905/12; B29K 2995/005
USPC ..... 428/315.5, 304.4, 319.3, 515.7; 219/494; 3/315.5, 304.4, 319.3, 515.7
See application file for complete search history.

(56) References Cited

U.S. PATENT DOCUMENTS

| | | | | |
|---|---|---|---|---|
| 6,676,077 B1 * | 1/2004 | DiChiara, Jr. | ............ | B64C 5/00 244/117 R |
| 7,776,430 B2 * | 8/2010 | Shao | ..................... | C04B 35/524 428/315.5 |
| 8,906,515 B2 * | 12/2014 | Tomantschger | ........ | B32B 15/08 428/626 |
| 9,108,506 B2 * | 8/2015 | Whitaker | ................ | B22F 7/004 |
| 2005/0003195 A1 * | 1/2005 | Joseph | .................. | B29C 70/443 428/408 |
| 2007/0261788 A1 * | 11/2007 | Stenard | ................... | B29C 33/40 156/307.1 |
| 2010/0239847 A1 * | 9/2010 | Darby | .................. | C08G 18/635 428/319.3 |
| 2011/0020631 A1 * | 1/2011 | Miller | .................... | C04B 35/524 428/315.5 |

(Continued)

*Primary Examiner* — Mark H Paschall
(74) *Attorney, Agent, or Firm* — Walters & Wasylyna LLC

(57) ABSTRACT

A tool including a tool body, the tool body including a substrate having a tool-side surface, an intermediate layer positioned over the tool-side surface, and an outer layer positioned over the intermediate layer, the outer layer including a metallic material.

20 Claims, 5 Drawing Sheets

(56) References Cited

U.S. PATENT DOCUMENTS

2012/0107555 A1\* 5/2012 Miller ................ B29C 33/3828
428/141

\* cited by examiner

LOW-COST TOOLING AND METHOD FOR MANUFACTURING THE SAME

PRIORITY

This application is a divisional of U.S. Ser. No. 14/677,575 filed on Apr. 2, 2015.

FIELD

This application relates to part fabrication and, more particularly, to low-cost tooling suitable for use in relatively low-pressure applications, such as composite molding applications.

BACKGROUND

Matched-metal tools have long been used for part fabrication (e.g., composite-part fabrication) because they are highly durable and produce very-high-quality parts. However, manufacturing matched-metal tools requires extensive precision machining and, therefore, is time-consuming and expensive. As such, tooling costs may render it economically unfeasible to use matched-metal tools for the fabrication of parts that have relatively low fabrication rates and/or relatively low part counts.

3D printing (additive manufacturing) techniques have been explored as a low-cost tooling option. 3D printing is attractive due to the ability to quickly obtain a physical tool from computer-aided design drawings. However, the technology in not yet mature and requires highly specialized equipment. Furthermore, the dimensional tolerances of 3D printed tools are not yet fully understood.

Composite tools can be a relatively low-cost tooling option. However, composite tools have struggled to achieve sufficiently high dimensional tolerances. Furthermore, a separate tool is generally required to manufacture the composite tool, thereby increasing overall tooling costs.

Accordingly, those skilled in the art continue with research and development efforts in the field of part fabrication.

SUMMARY

In one embodiment, the disclosed tool may include a tool body having a substrate, the substrate having a tool-side surface, an intermediate layer positioned over the tool-side surface, and an outer layer positioned over the intermediate layer, the outer layer including a metallic material.

In another embodiment, the disclosed tool may include a tool body having a foam substrate, the foam substrate having a tool-side surface, an intermediate layer positioned over the tool-side surface, and an outer layer positioned over the intermediate layer, the outer layer including a metallic material.

In yet another embodiment, the disclosed method for manufacturing a tool may include steps of (1) machining a substrate to a desired shape, the substrate including a non-solid-metal material; (2) applying an intermediate layer to the machined substrate; and (3) applying an outer layer over the intermediate layer, the outer layer including a metallic material.

Other embodiments of the disclosed low-cost tooling and method for manufacturing the same will become apparent from the following detailed description, the accompanying drawings and the appended claims.

DETAILED DESCRIPTION

Figure 1:
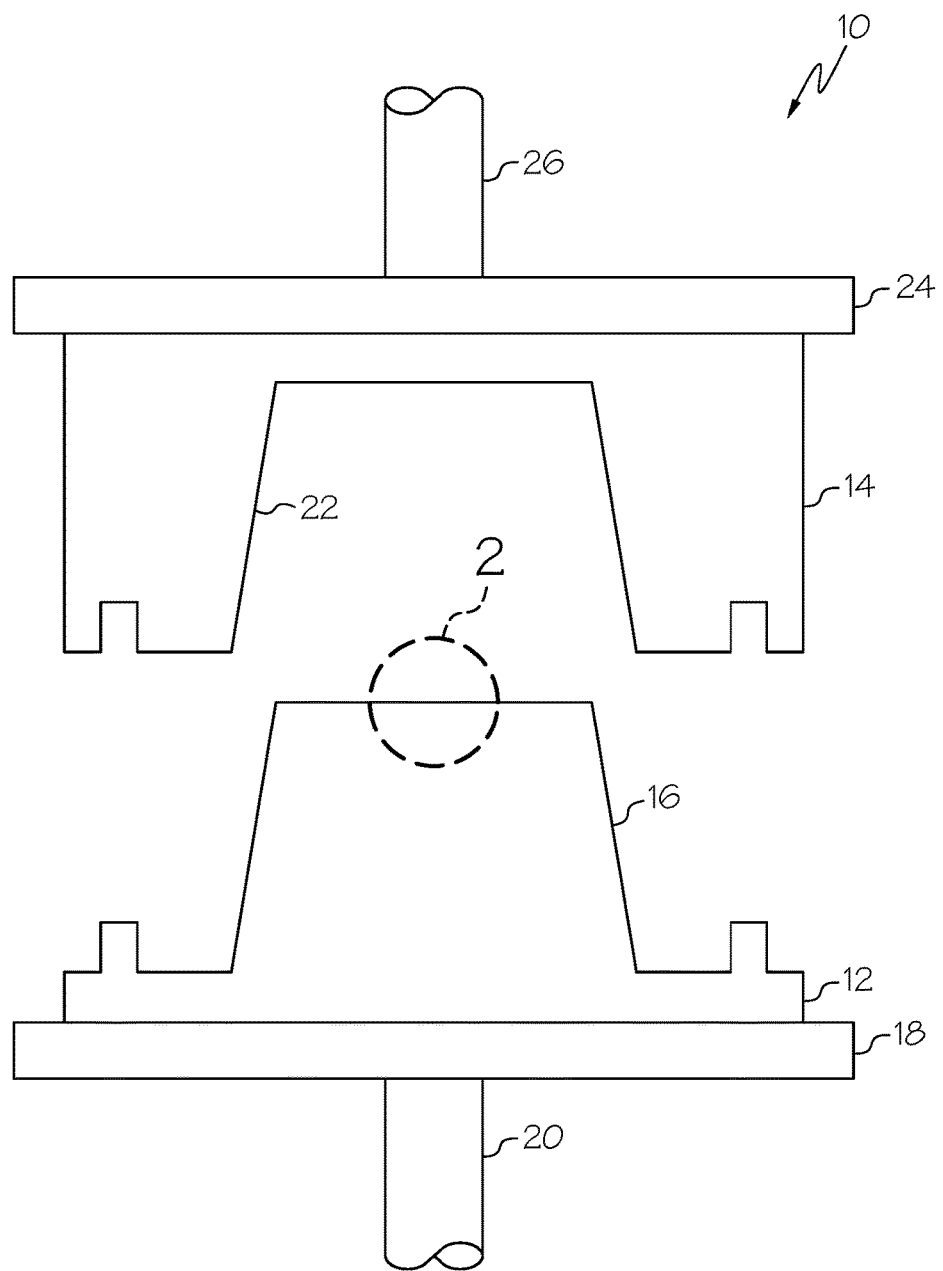
FIG. 1 is a schematic side elevational view of a tooling assembly, which includes a male mold member and a female mold member that have been manufactured in accordance with the present disclosure.

Referring to FIG. 1, one example implementation of the disclosed tooling assembly, generally designated 10, may include a first tool 12 and a corresponding second tool 14. The first tool 12 includes a first tool surface 16 and may be connected to a first support 18. The first support 18 may be a platen and may be driven, such as by way of a first press ram 20. The second tool 14 includes a second tool surface 22, and may be connected to a second support 24. The second support 24 may be a platen and may be driven, such as by way of a second press ram 26.

As a specific, non-limiting example, the first tool 12 may be a male mold member and the second tool 14 may be a female mold member. The first tool 12 may be sized and shaped to engage the second tool 14 to form a closed mold. Therefore, a part (e.g., a composite part) may be fabricated by positioning a pliable material between the first and second tools 12, 14 and then approximating the tools 12, 14 to achieve the desired pressure and, ultimately, the desired part shape.

While the tools 12, 14 of the tooling assembly 10 are shown in FIG. 1 as male and female mold members having a particular configuration, shape and size, various tools having various configurations, shapes and sizes may be manufactured using the disclosed low-cost tooling techniques without departing from the scope of the present disclosure. Those skilled in the art appreciate that that the particular configuration, shape and size of a tool will depend on the tooling assembly in which the tool will be implemented and the dimensions of the part to be fabricated by the tool.

Furthermore, while the tooling assembly 10 is shown in FIG. 1 being configured for closed mold processing, other implementations of the disclosed low-cost tooling are also contemplated. In one alternative implementation, the disclosed tooling assembly may be configured for single-sided (e.g., open mold) processing and, therefore, may include only one tool (e.g., tool 12).

Figure 2:
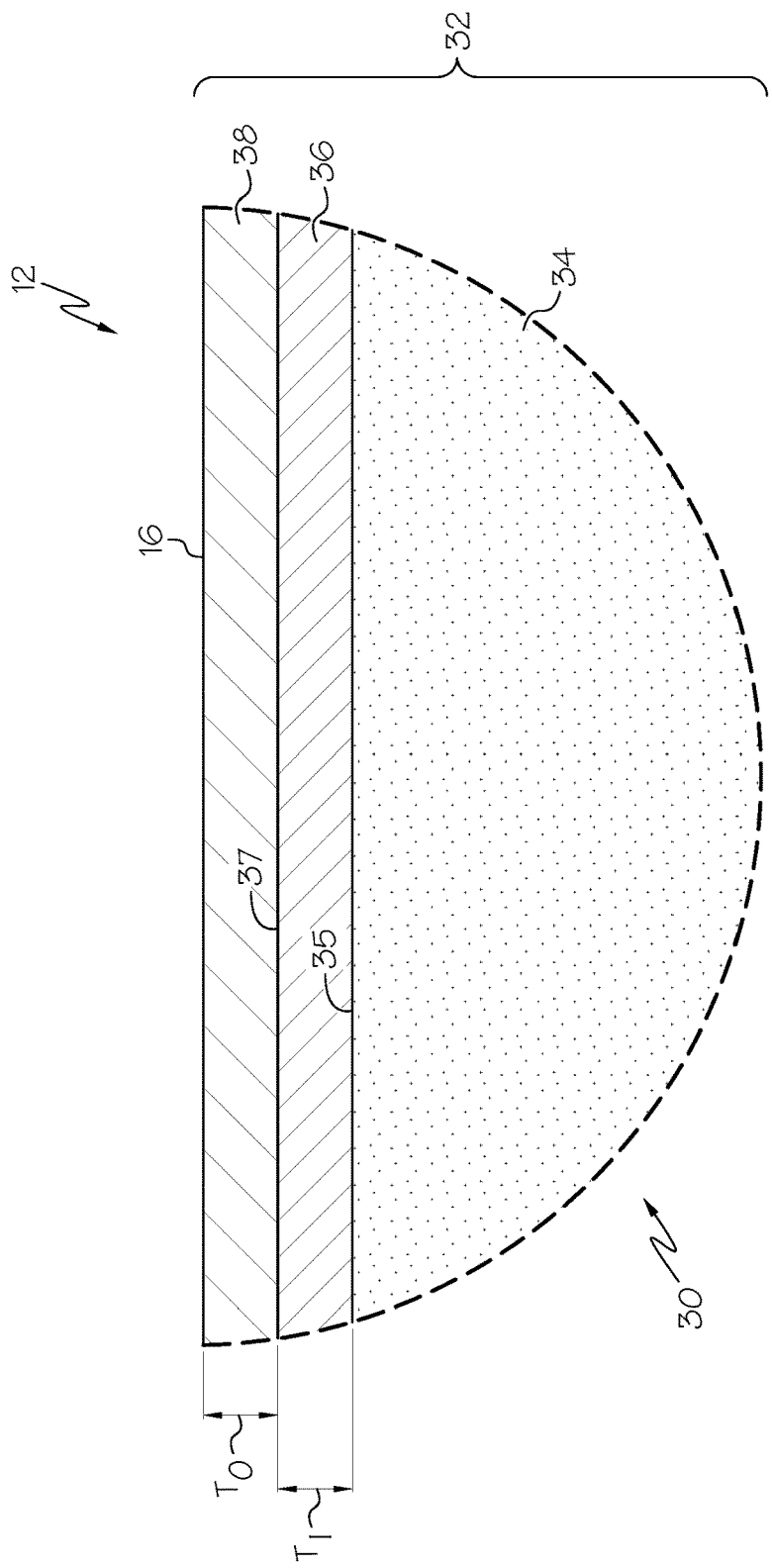
FIG. 2 is a detailed cross-sectional view of a portion of the male mold member of the tooling assembly of FIG. 1 in accordance with one embodiment of the present disclosure.

Referring to FIG. 2, in one embodiment, the first tool 12 of the tooling assembly 10 (FIG. 1) has a tool body 30 constructed as a layered structure 32 that includes a substrate 34, an intermediate layer 36 and an outer layer 38. The intermediate layer 36 and the outer layer 38 may be applied to the substrate 34 such that the intermediate layer 36 is positioned between the substrate 34 and the outer layer 38. The outer layer 38 defines the first tool surface 16 of the first tool 12.

The second tool 14 (FIG. 1) of the tooling assembly 10 (FIG. 1) has a tool body constructed in a similar manner as the tool body 30 of the first tool 12. Therefore, the tool body of the second tool 12 is not separately shown in cross-section and described. It is also contemplated that one of the first and second tools 12, 14 may have a tool body 30 constructed as shown and described herein, while the other of the first and second tools 12, 14 may have a tool body with another, different construction (e.g., a traditional matched-metal tool construction).

The substrate 34 of the layered structure 32 of the tool body 30 may form the bulk of the tool body 30. To reduce tooling costs, the substrate 34 is not a solid metal or metal alloy, as in the case of matched-metal tools. Solid metals and metal alloys are relatively difficult to machine. Rather, the substrate 34 is a non-solid-metal material that has at least moderate strength (considering the pressures to which the tool body 30 will be subjected), is easily machinable (to a desired shape), and is dimensionally stable (capable of holding the machined shape).

Various materials may be used to form the substrate 34 of the layered structure 32 of the tool body 30. Material selection may be dictated more (if not entirely) by the machinability, strength and dimensional stability of the material, rather than the chemical composition and the physical form of the material. Indeed, the chemical composition and physical form of the substrate may vary widely without departing from the scope of the present disclosure.

In one particular expression, the substrate 34 of the layered structure 32 of the tool body 30 may be formed from (or may include) a foam. The foam may be a machinable foam. The foam may be formed from any structural material capable of imparting the foam with the requisite machinability, strength and dimensional stability. As one non-limiting example, the substrate 34 may be formed from carbon foam, such as graphite foam. As another non-limiting example, the substrate 34 may be formed from a polymeric foam, such as polyimide foam. As another non-limiting example, the substrate 34 may be formed from a silicone foam, such as a filled silicone foam. As yet another non-limiting example, the substrate 34 may be formed from a metallic foam, such as aluminum foam or a hybrid foam.

The intermediate layer 36 of the layered structure 32 of the tool body 30 may be applied to the tool-side surface 35 of the substrate 34. Therefore, the intermediate layer 36 may seal the tool-side surface 35 of the substrate 34. Furthermore, the intermediate layer 36 may be flexible to accommodate for mismatch between the coefficient of thermal expansion of the substrate 34 and the coefficient of thermal expansion of the outer layer 38 (e.g., the intermediate layer 36 may expand with outer layer 38 when the tool body 30 is heated). Still furthermore, when the outer layer 38 will be applied by electrodeposition, the intermediate layer 36 provides an electrically conductive surface 37 onto which the outer layer 38 is applied.

The intermediate layer 36 of the layered structure 32 of the tool body 30 has a cross-sectional thickness $T_I$. The cross-sectional thickness $T_I$ of the intermediate layer 36 depends on the composition of the intermediate layer 36, the composition of the outer layer 38 and/or the cross-sectional thickness $T_O$ of the outer layer 38, among other possible factors. As one example, the cross-sectional thickness $T_I$ of the intermediate layer 36 may range from about 1 mil (25.4 μm) to about 1000 mil (25,400 μm). As another example, the cross-sectional thickness $T_I$ of the intermediate layer 36 may range from about 1 mil (25.4 μm) to about 100 mil (2540 μm). As yet another example, the cross-sectional thickness $T_I$ of the intermediate layer 36 may range from about 1 mil (25.4 μm) to about 10 mil (254 μm).

Various materials may be used to form the intermediate layer 36 of the layered structure 32 of the tool body 30. However, the particular composition of the intermediate layer 36 may be dictated by the functionality of the intermediate layer 36. For example, when flexibility is required, the intermediate layer 36 may be formed from (or may include) a low-modulus material (e.g., a material having a Young's modulus of at most 1 GPa, such as at most about 0.1 GPa). As one specific, non-limiting example, the intermediate layer 36 may be formed from silicone, such as room-temperature-vulcanization (RTV) silicone, which is a low-modulus material.

The intermediate layer 36 of the layered structure 32 of the tool body 30 has an electrically conductive surface 37 to facilitate receiving the outer layer 38, such as by way of electrodeposition. Various techniques may be used to provide the intermediate layer 36 with an electrically conductive surface 37.

In one implementation, the intermediate layer 36 of the layered structure 32 of the tool body 30 may be formed from (or may include) an electrically conductive material, thereby providing the electrically conductive surface 37. For example, an electrically conductive filler may be incorporated into the intermediate layer 36. Non-limiting examples of electrically conductive fillers that may be incorporated into the intermediate layer 36 include carbon black, carbon fibers, graphene, carbon nanotubes, conductive metal powders, and the like. The electrically conductive filler may be uniformly dispersed throughout the intermediate layer or, alternatively, may be concentrated proximate (at or near) the surface 37 of the intermediate layer 36.

In another implementation, an electrically conductive layer (not shown) may be applied to the surface 37 of the intermediate layer 36 of the layered structure 32 of the tool body 30. For example, a layer of metal (e.g., nickel) may be applied to the surface 37 of the intermediate layer 36, such as by electroless plating.

The outer layer 38 of the layered structure 32 of the tool body 30 may be applied to the surface 37 of the intermediate layer 36. The outer layer 38 forms the first tool surface 16 of the first tool 12.

The outer layer 38 of the layered structure 32 of the tool body 30 may be formed from (or may include) a metallic material (e.g., a metal or a metal alloy). The metallic material forming the outer layer 38 may be applied to the surface 37 of the intermediate layer 36 using electrodeposition. Various electrodeposition processes (e.g., electroplating) may be used without departing from the scope of the present disclosure.

While various electrodeposition techniques may be suitable for forming the outer layer 38 of the layered structure 32 of the tool body 30, other processes capable of depositing a metallic layer onto to the surface 37 of the intermediate layer 36 may also be used. As one alternative example, the outer layer 38 may be formed by thermal spraying. As another alternative example, the outer layer 38 may be formed by chemical vapor deposition.

Various metallic materials may be used to form the outer layer 38 of the layered structure 32 of the tool body 30 without departing from the scope of the present disclosure. The type of metallic material used to form the outer layer 38 may be dictated by the intended use of the tool 12, as well as the technique (e.g., electrodeposition) used to apply the outer layer 38, among other possible factors.

In one expression, the metallic outer layer 38 of the layered structure 32 of the tool body 30 may include at least one member selected from the group consisting of silver (Ag), aluminum (Al), gold (Au), beryllium (Be), cobalt (Co), chromium (Cr), copper (Cu), iron (Fe), mercury (Hg), indium (In), magnesium (Mg), manganese (Mn), molybdenum (Mo), niobium (Nb), neodymium (Nd), nickel (Ni), phosphorus (P), palladium (Pd), platinum (Pt), rhenium (Re), rhodium (Rh), antimony (Sb), tin (Sn), lead (Pb), tantalum (Ta), titanium (Ti), tungsten (W), vanadium (V), zinc (Zn) and zirconium (Zr).

In another expression, the metallic outer layer 38 of the layered structure 32 of the tool body 30 may include at least two members selected from the group consisting of silver (Ag), aluminum (Al), gold (Au), beryllium (Be), cobalt (Co), chromium (Cr), copper (Cu), iron (Fe), mercury (Hg), indium (In), magnesium (Mg), manganese (Mn), molybdenum (Mo), niobium (Nb), neodymium (Nd), nickel (Ni), phosphorus (P), palladium (Pd), platinum (Pt), rhenium (Re), rhodium (Rh), antimony (Sb), tin (Sn), lead (Pb), tantalum (Ta), titanium (Ti), tungsten (W), vanadium (V), zinc (Zn) and zirconium (Zr).

In another expression, the metallic outer layer 38 of the layered structure 32 of the tool body 30 may include at least three members selected from the group consisting of silver (Ag), aluminum (Al), gold (Au), beryllium (Be), cobalt (Co), chromium (Cr), copper (Cu), iron (Fe), mercury (Hg), indium (In), magnesium (Mg), manganese (Mn), molybdenum (Mo), niobium (Nb), neodymium (Nd), nickel (Ni), phosphorus (P), palladium (Pd), platinum (Pt), rhenium (Re), rhodium (Rh), antimony (Sb), tin (Sn), lead (Pb), tantalum (Ta), titanium (Ti), tungsten (W), vanadium (V), zinc (Zn) and zirconium (Zr).

In yet another expression, the metallic outer layer 38 of the layered structure 32 of the tool body 30 may include at least four members selected from the group consisting of silver (Ag), aluminum (Al), gold (Au), beryllium (Be), cobalt (Co), chromium (Cr), copper (Cu), iron (Fe), mercury (Hg), indium (In), magnesium (Mg), manganese (Mn), molybdenum (Mo), niobium (Nb), neodymium (Nd), nickel (Ni), phosphorus (P), palladium (Pd), platinum (Pt), rhenium (Re), rhodium (Rh), antimony (Sb), tin (Sn), lead (Pb), tantalum (Ta), titanium (Ti), tungsten (W), vanadium (V), zinc (Zn) and zirconium (Zr).

As one general, non-limiting example, the outer layer 38 of the layered structure 32 of the tool body 30 is a plating layer formed from a strong, wear-resistant metal alloy. As one specific, non-limiting example, the outer layer 38 is steel plating.

The outer layer 38 of the layered structure 32 of the tool body 30 has a cross-sectional thickness $T_O$. The cross-sectional thickness $T_O$ of the outer layer 38 depends on the composition of the outer layer 38, the technique used to apply the outer layer 38 to the intermediate layer 36 and/or the intended use to the tool 12, among other possible factors. As one example, the cross-sectional thickness $T_O$ of the outer layer 38 may be at most about 100 mil (2,540 μm). As another example, the cross-sectional thickness $T_O$ of the outer layer 38 may range from about 1 mil (25.4 μm) to about 75 mil (1,905 μm). As another example, the cross-sectional thickness $T_O$ of the outer layer 38 may range from about 1 mil (25.4 μm) to about 50 mil (1,270 μm). As another example, the cross-sectional thickness $T_O$ of the outer layer 38 may range from about 1 mil (25.4 μm) to about 25 mil (635 μm). As yet another example, the cross-sectional thickness $T_O$ of the outer layer 38 may range from about 1 mil (25.4 μm) to about 10 mil (25.4 μm).

Figure 3:
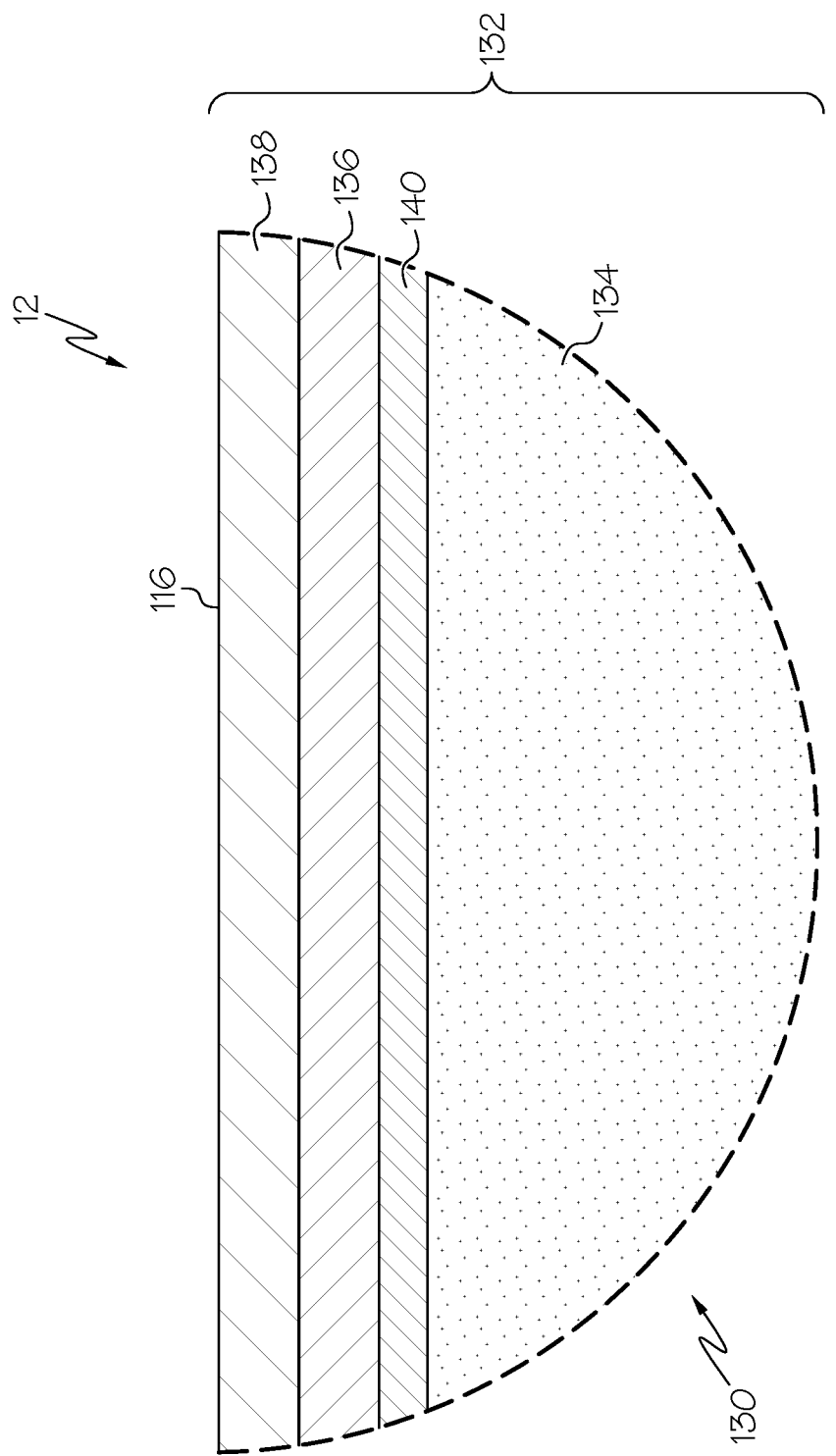
FIG. 3 is a detailed cross-sectional view of a portion of the male mold member of the tooling assembly of FIG. 1 in accordance with another embodiment of the present disclosure.

Referring to FIG. 3, in another embodiment, the first tool 12 of the tooling assembly 10 (FIG. 1) has a tool body 130 constructed as a layered structure 132 that include a substrate 134, an intermediate layer 136, an outer layer 138, and a heating layer 140. The second tool 14 (FIG. 1) of the tooling assembly 10 (FIG. 1) has a tool body constructed in a similar manner as the tool body 130 of the first tool 12 and, therefore, is not separately shown in cross-section and described.

The substrate 134, the intermediate layer 136 and the outer layer 138 of the layered structure 132 of the tool body 130 may be the same as or similar to the substrate 34, the intermediate layer 36 and the outer layer 38 of the layered structure 32 of the tool body 30 shown in FIG. 2 and described above. Therefore, the heating layer 140 differentiates tool body 130 (FIG. 3) from tool body 30 (FIG. 2).

The heating layer 140 of the layered structure 132 of the tool body 130 may be positioned between the substrate 134 and the outer layer 138. For example, the heating layer 140 is positioned between the substrate 134 and the intermediate layer 136. Therefore, the heating layer 140 will facilitate heating of the tool surface 116 of the tool 12 while the tool 12 is in service. For example, the heating layer 140 will facilitate heating of the tool surface 116 to a requisite forming temperature, such as a temperature ranging from about 100° C. to about 250° C.

The heating layer 140 may include a heating element that generates heat when an electrical current is passed therethrough. Therefore, the heating layer 140 may employ resistive heating to heat the tool surface 116 of the tool 12. For example, the heating layer 140 includes a heating element configured as a wire mesh, such as a cupronickel wire mesh or a nichrome 80/20 wire mesh.

While the heating layer 140 is shown in FIG. 3 as a distinct, separate layer, the heating layer 140 may optionally be incorporated into the intermediate layer 136. For example, the intermediate layer 136 surrounds the heating layer 140.

Figure 4:
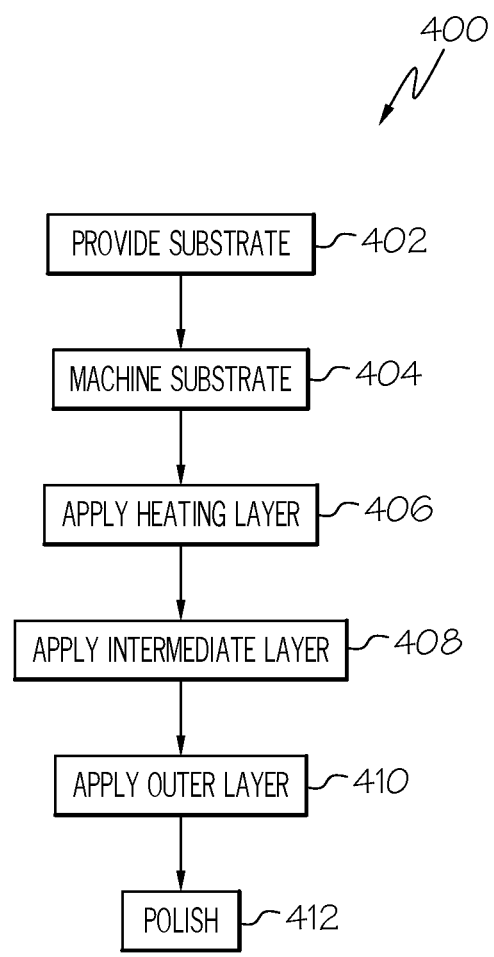
FIG. 4 is a flow diagram depicting one embodiment of the disclosed method for manufacturing a tool.

Referring to FIG. 4, also disclosed is a method 400 for manufacturing a tool. The method 400 may begin at Block 402 with the step of providing a substrate. The substrate may be a non-solid-metal material having the requisite machinability, strength and dimensional stability. As one general, non-limiting example, the substrate is a foam. As one specific, non-limiting example, the substrate is a carbon foam (e.g., graphite foam).

At Block 404, the substrate may be machined to the desired shape within set (e.g., tight) tolerances. The machining step (Block 404) may use various machining apparatus/techniques to remove material from the substrate until the desired shape is achieved. Multiple different machining apparatus/techniques may be employed to achieve the desired shape of the substrate.

At this point, those skilled in the art will appreciate that additional layers (e.g., the intermediate layer 36 and the outer layer 38 shown in FIG. 2) will be applied to the machined substrate. Therefore, the machining step (Block 404) may accommodate for the growth due to additional layers by removing sufficient material from the substrate. As such, the final finished tool (substrate plus additional layers) has the desired shape within set (e.g., tight) tolerances.

At Block 406, an optional heating layer may be applied over the tool-side surface of the machined substrate. The heating layer may include a heating element, such as a wire mesh, which generates heat by way of resistive heating.

At Block 408, an intermediate layer may be applied over the heating layer or, alternatively, over the tool-side surface of the machined substrate (when a heating layer is not used). The intermediate layer may seal the tool-side surface of the machined substrate, may be flexible to accommodate for mismatch between the coefficient of thermal expansion of the substrate and the coefficient of thermal expansion of the outer layer, and, if necessary (depending on the technique used in Block 410), may provide an electrically conductive surface onto which the outer layer may be applied.

Various techniques may be used to apply the intermediate layer (Block 408). The application technique used for intermediate layer application (Block 408) may depend on the composition of the intermediate layer, among other possible factors. For example, when the intermediate layer is room-temperature-vulcanization (RTV) silicone, the intermediate layer may be applied by casting, spraying, dip-coating, or the like.

At Block 410, an outer layer may be applied over the intermediate layer to form the tool surface of the resulting tool. The outer layer may include a metallic material. As one specific, non-limiting example, the outer layer is steel.

Various techniques may be used to apply the outer layer (Block 410). As one general, non-limiting example, the outer-layer-application step (Block 410) includes electrodeposition. As one specific, non-limiting example, the outer-layer-application step (Block 410) includes electroplating. As another example, the outer-layer-application step (Block 410) includes thermal spraying. As yet another example, the outer-layer-application step (Block 410) includes chemical vapor deposition.

At Block 412, the tool surface may be polished. Those skilled in the art will appreciate that polishing (Block 412) is optional, and may only be performed as required.

Accordingly, the disclosed method 400 may yield a tool by machining only a substrate—a substrate that is easily machinable. Then, a tool surface is provided by applying onto the machined substrate an intermediate layer and a metallic outer layer. As such, the resulting tool may be more easily and cost-effectively manufactured.

Figure 5:
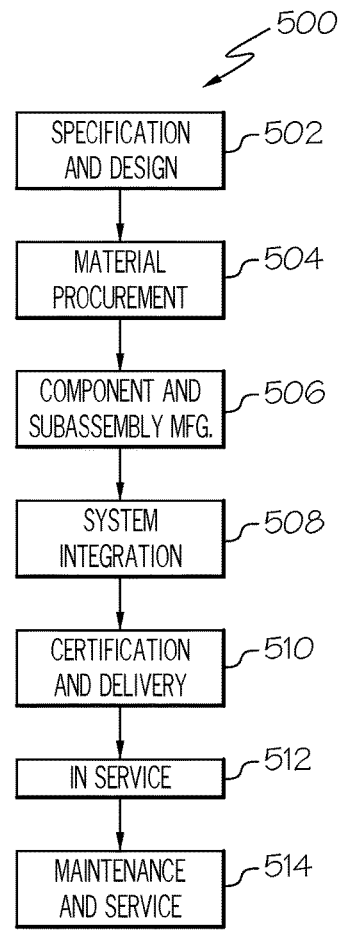
FIG. 5 is a flow diagram of an aircraft manufacturing and service methodology.
Figure 6:
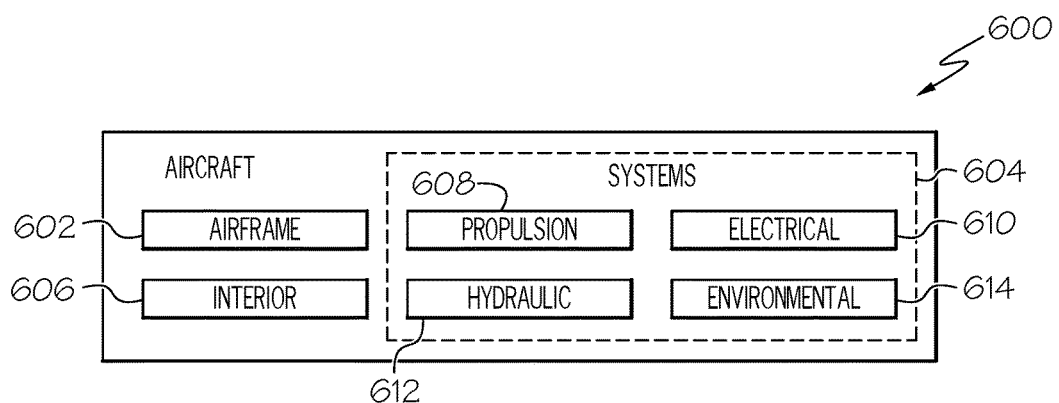
FIG. 6 is a block diagram of an aircraft.

Examples of the present disclosure may be described in the context of an aircraft manufacturing and service method 500 as shown in FIG. 5 and an aircraft 600 as shown in FIG. 6. During pre-production, the illustrative method 500 may include specification and design, as shown at block 502, of the aircraft 600 and material procurement, as shown at block 504. During production, component and subassembly manufacturing, as shown at block 506, and system integration, as shown at block 508, of the aircraft 600 may take place. Thereafter, the aircraft 600 may go through certification and delivery, as shown block 510, to be placed in service, as shown at block 512. While in service, the aircraft 600 may be scheduled for routine maintenance and service, as shown at block 514. Routine maintenance and service may include modification, reconfiguration, refurbishment, etc. of one or more systems of the aircraft 600.

Each of the processes of illustrative method 500 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 6, the aircraft 600 produced by illustrative method 500 (FIG. 5) may include airframe 602 with a plurality of high-level systems 604 and interior 606. Examples of high-level systems 604 may include one or more of propulsion system 608, electrical system 610, hydraulic system 612, and environmental system 614. Any number of other systems may be included. Although an aerospace example is shown, the principles disclosed herein may be applied to other industries, such as the automotive and marine industries. Accordingly, in addition to the aircraft 600, the principles disclosed herein may apply to other vehicles (e.g., land vehicles, marine vehicles, space vehicles, etc.).

The disclosed low-cost tooling may be employed during any one or more of the stages of the manufacturing and service method 500. For example, components or subassemblies corresponding to component and subassembly manufacturing (block 506) may be fabricated or manufactured using the disclosed low-cost tooling. Also, the disclosed low-cost tooling may be utilized during production stages (blocks 506 and 508), for example, by substantially expediting assembly of or reducing the cost of aircraft 600. Similarly, the disclosed low-cost tooling may be utilized, for example and without limitation, while aircraft 600 is in service (block 512) and/or during the maintenance and service stage (block 514).

Although various embodiments of the disclosed low-cost tooling and method for manufacturing the same have been shown and described, modifications may occur to those skilled in the art upon reading the specification. The present application includes such modifications and is limited only by the scope of the claims.

What is claimed is:

1. A method for manufacturing a tool comprising:
   machining a substrate to a desired shape;
   providing an intermediate layer on said machined substrate, said intermediate layer comprising:
      an outer surface facing away from said machined substrate; and
      an electrically conductive filler dispersed within a low-modulus material, said electrically conductive filler being concentrated proximate said outer surface of said intermediate layer; and
   electrodepositing an outer layer on said intermediate layer, said outer layer comprising a metallic material.

2. The method of claim 1 wherein said outer surface is electrically conductive.

3. The method of claim 1, further comprising positioning a heating layer between said machined substrate and said outer layer.

4. The method of claim 1 wherein said substrate comprises a non-solid-metal material.

5. The method of claim 1 wherein said substrate is a machinable foam.

6. The method of claim 1 wherein said substrate comprises at least one of a carbon foam, a polymeric foam, a silicone foam and a metallic foam.

7. The method of claim 1 wherein said substrate comprises graphite foam.

8. The method of claim 1 wherein said intermediate layer has a cross-sectional thickness ranging from about 1 mil to about 100 mil.

9. The method of claim 1 wherein said outer layer has a cross-sectional thickness of at most about 100 mil.

10. The method of claim 1 wherein said intermediate layer comprises a layer positioned over an outermost surface of said machined substrate.

11. The method of claim 1 wherein said intermediate layer comprises a cross-sectional thickness of at least about 1 mil positioned over an outermost surface of said machined substrate.

12. The method of claim 1 wherein said electrically conductive filler includes electrically conductive particles dispersed within said low-modulus material.

13. The method of claim 1 wherein said intermediate layer has a Young's modulus of at most 1 GPa.

14. A method for manufacturing a tool comprising:
machining a substrate to a desired shape;
providing a heating layer and an intermediate layer on said machined substrate, said intermediate layer comprising an outer surface and an electrically conductive filler that is concentrated proximate said outer surface of said intermediate layer; and
providing an outer layer on said heating layer and said intermediate layer, said outer layer comprising a metallic material,
wherein said heating layer is positioned between said machined substrate and said outer layer, and wherein said intermediate layer is positioned between said machined substrate and said outer layer.

15. The method of claim 14 wherein said intermediate layer is provided on said heating layer.

16. The method of claim 14 wherein heating layer is incorporated into said intermediate layer.

17. The method of claim 16 wherein said intermediate layer surrounds said heating layer.

18. The method of claim 14 wherein said heating layer comprises a wire mesh.

19. The method of claim 14 wherein said machined substrate comprises an outer surface facing the intermediate layer and the outer layer comprises a inner surface facing the intermediate layer, wherein the heating layer is positioned between the outer surface of the machined substrate and the inner surface of the outer layer, and wherein the intermediate layer is positioned between the outer surface of the machined substrate and the inner surface of the outer layer.

20. A method for manufacturing a tool comprising:
machining a substrate to a desired shape, wherein said substrate comprises at least one of a polymeric foam, a silicone foam and a metallic foam;
applying an intermediate layer on said machined substrate, said intermediate layer comprising an outer surface and an electrically conductive filler that is concentrated proximate said outer surface of said intermediate layer, wherein said electrically conductive filler comprises one of carbon black, carbon fibers, graphene, carbon nanotubes and conductive metal powders; and
depositing an outer layer on said intermediate layer, said outer layer comprising a metallic material.

* * * * *